US012653038B2

(12) United States Patent
Kitagawa et al.

(10) Patent No.: US 12,653,038 B2
(45) Date of Patent: Jun. 9, 2026

(54) SEMICONDUCTOR DEVICE

(71) Applicant: RENESAS ELECTRONICS CORPORATION, Tokyo (JP)

(72) Inventors: Katsuhiko Kitagawa, Tokyo (JP); Takehiko Maeda, Tokyo (JP); Kuniharu Muto, Tokyo (JP); Takeshi Miyakoshi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 452 days.

(21) Appl. No.: 18/172,665

(22) Filed: Feb. 22, 2023

(65) Prior Publication Data

US 2023/0369179 A1 Nov. 16, 2023

(30) Foreign Application Priority Data

May 13, 2022 (JP) ................................. 2022-079236

(51) Int. Cl.
*H10W 70/40* (2026.01)
*H10W 72/59* (2026.01)
(Continued)

(52) U.S. Cl.
CPC ....... *H10W 70/417* (2026.01); *H10W 70/457* (2026.01); *H10W 72/90* (2026.01); *H10W 74/016* (2026.01); *H10W 74/114* (2026.01); *H10W 72/59* (2026.01); *H10W 74/00* (2026.01); *H10W 90/756* (2026.01)

(58) Field of Classification Search
CPC ............... H01L 21/565; H01L 23/3121; H01L 23/49582; H01L 23/49513; H01L 23/49503; H01L 23/3107; H01L 23/49548; H01L 23/31; H01L 23/49568; H01L 2224/04042; H01L 2224/48247; H01L 2924/181; H01L 2924/35121; H01L 24/05; H01L 24/48
See application file for complete search history.

(56) References Cited

U.S. PATENT DOCUMENTS

| | | |
|---|---|---|
| 10,522,446 B2 | 12/2019 | Nishikizawa et al. |
| 2002/0153596 A1* | 10/2002 | Tsubosaki ............... H01L 24/97 |
| | | 257/676 |

(Continued)

FOREIGN PATENT DOCUMENTS

| | | |
|---|---|---|
| JP | 2018-085480 A | 5/2018 |
| JP | 2019-040994 A | 3/2019 |

*Primary Examiner* — Teresa M. Arroyo
(74) *Attorney, Agent, or Firm* — Rimon P.C.

(57) ABSTRACT

A semiconductor device includes: a die pad having an upper surface facing a semiconductor chip, a metal film formed on the upper surface, and a bonding material formed so as to cover the metal film. Here, the upper surface has: a first region overlapping the semiconductor chip, a second region not overlapping the semiconductor chip, a third region included in the first region and covered with the metal film, and a fourth region included in the first region and adjacent to the third region and also not covered with the metal film. Also, the semiconductor chip is mounted on the die pad such that a center of the semiconductor chip overlaps the third region. Further, an area of the third region is greater than or equal to 11% of an area of the first region, and less than or equal to 55% of the area of the first region.

9 Claims, 9 Drawing Sheets

(51) Int. Cl.

| | | |
|---|---|---|
| *H10W 72/90* | (2026.01) | |
| *H10W 74/00* | (2026.01) | |
| *H10W 74/01* | (2026.01) | |
| *H10W 74/10* | (2026.01) | |
| *H10W 90/00* | (2026.01) | |

(56) References Cited

U.S. PATENT DOCUMENTS

| | | | |
|---|---|---|---|
| 2009/0039486 A1* | 2/2009 | Shimazaki | H01L 21/568 |
| | | | 29/829 |
| 2010/0258922 A1* | 10/2010 | Nakamura | H01L 21/56 |
| | | | 257/676 |
| 2014/0001620 A1* | 1/2014 | Shimizu | H01L 23/4952 |
| | | | 257/676 |
| 2014/0027891 A1* | 1/2014 | Kimura | H01L 24/83 |
| | | | 438/122 |
| 2018/0151479 A1* | 5/2018 | Nishikizawa | H01L 24/32 |
| 2019/0157196 A1* | 5/2019 | Sonehara | H01L 23/4952 |
| 2020/0273813 A1* | 8/2020 | Daryl Wee | H01L 23/562 |
| 2021/0375787 A1* | 12/2021 | Crema | H01L 23/4952 |

* cited by examiner

SEMICONDUCTOR DEVICE

CROSS-REFERENCE TO RELATED APPLICATIONS

The disclosure of Japanese Patent Application No. 2022-079236 filed on May 13, 2022, including the specification, drawings and abstract is incorporated herein by reference in its entirety.

BACKGROUND

The present invention relates to a semiconductor device. Here, there are disclosed techniques listed below.
[Patent Document 1] Japanese Unexamined Patent Application Publication No. 2018-85480
[Patent Document 2] Japanese Unexamined Patent Application Publication No. 2019-40994
Patent Document 1 discloses a technique in which an end portion of a chip mounting surface of a die pad is set higher than an upper surface of a chip.

As a technique for improving the heat dissipation property of a semiconductor chip, there is a technique in which a plating film is formed on a chip mounting surface of a die pad and the semiconductor chip is mounted on the plating film via a silver paste material (for example, see Patent Document 1 and Patent Document 2).

SUMMARY

According to studies by the inventors of the present application, it has been found that, in a semiconductor device in which a semiconductor chip is mounted on a plating film via a silver paste material, peeling occurs at an interface between the plating film and the silver paste material. As another examined example, the inventor of the present application has studied a semiconductor device in which a semiconductor chip is mounted on a roughened chip mounting surface via a silver paste material and without using a plated film. In this another examined example, it was found that peeling occurs at the interface between the silver paste material and the chip mounting surface due to air bubbles trapped between the roughened chip mounting surface and the silver paste material. Heat generated by the operation of the semiconductor chip is dissipated to the outside of the semiconductor device (semiconductor package) via the die pad, but when peeling occurs at the interface between the die bonding material and the die pad, the heat dissipation efficiency is reduced.

An object of the present disclosure is to improve the performance of a semiconductor device. Other objects and novel features will become apparent from the description of this specification and the accompanying drawings.

A semiconductor device according to one embodiment, includes: a chip mounting portion having a first surface facing a semiconductor chip; a first metal film formed on the first surface; and a bonding material formed so as to cover the first metal film. The first surface has: a first region overlapping the semiconductor chip, a second region not overlapping the semiconductor chip, a third region included in the first region and covered with the first metal film, and a fourth region included in the first region and adjacent to the third region and also not covered with the first metal film. The semiconductor chip is mounted on the chip mounting portion such that a center of the semiconductor chip overlaps the third region. The first metal film is comprised of a metal material which is less likely to be oxidized than a metal material of the chip mounting portion. A surface roughness of the first surface in the fourth region is rougher than a surface roughness of a contacting surface, to which the bonding material is to be contacted, of the first metal film. An area of the third region is greater than or equal to 11% of an area of the first region, and less than or equal to 55% of the area of the first region.

According to the above embodiment, it is possible to improve the performance of the semiconductor device.

BRIEF DESCRIPTION OF THE DRAWINGS

FIG. 6 is an enlarged cross-sectional view taken along line B-B of FIG. 5.

FIG. 8 is an enlarged cross-sectional view showing a modified example with respect to FIG. 6.

DETAILED DESCRIPTION

Figure 1:
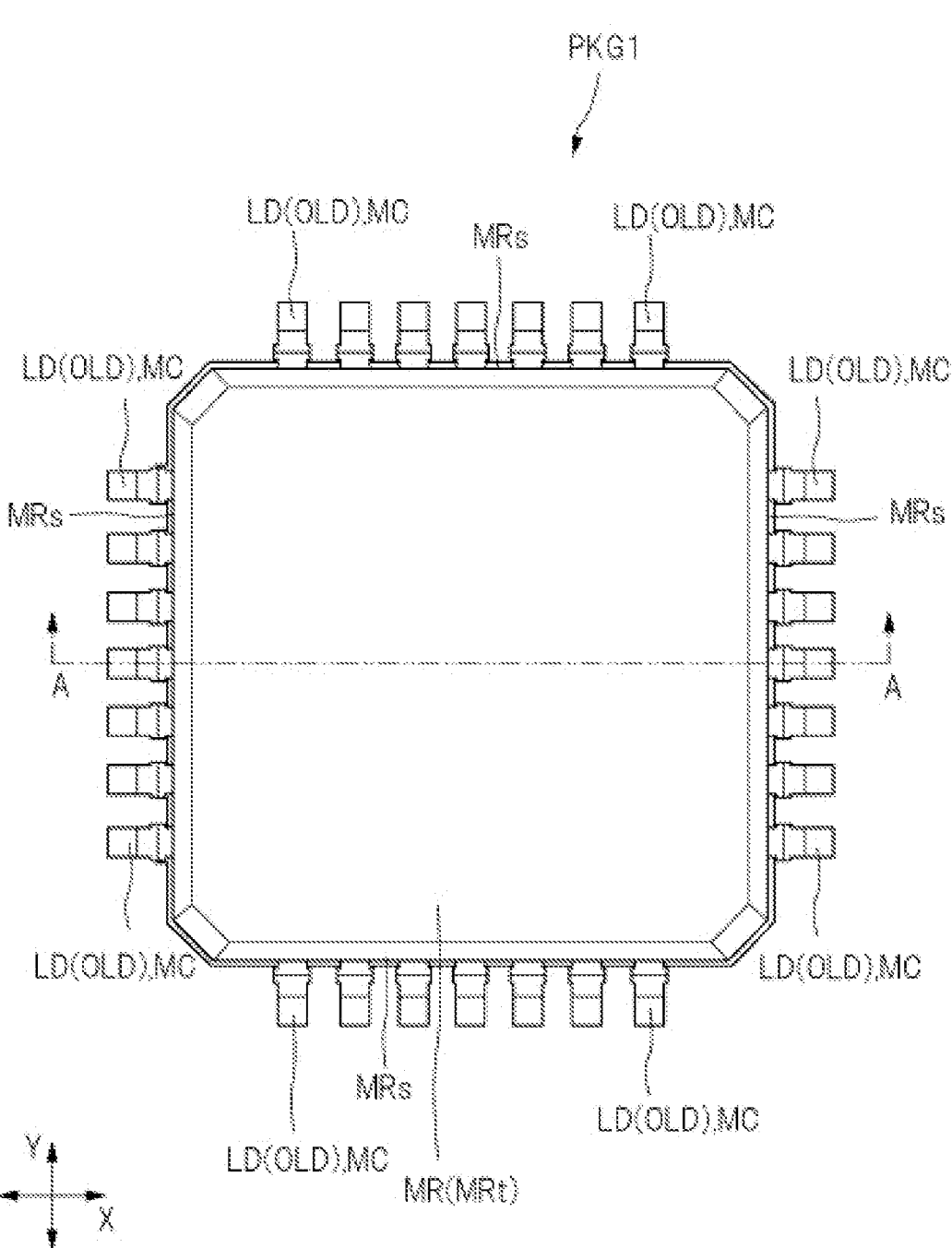
FIG. 1 is an upper surface view of a semiconductor device according to one embodiment.

Description of Forms, Basic Terms, and Usage in This Application

In the present application, the description of the embodiment will be divided into a plurality of sections or the like as required for convenience, but unless expressly stated otherwise, these are not independent of each other, and each part of a single example, one of which is a partial detail or a part or all of the other, whether before or after the description, or the like, is modified example or the like. In principle, descriptions of similar parts are omitted. Also, each component in an embodiment is not essential, unless expressly stated otherwise, theoretically limited to that number, and obviously otherwise from the context.

Similarly, in the description of the embodiment and the like, "X consisting of A" or the like with respect to the material, composition, and the like does not exclude elements other than A, except when it is clearly indicated that this is not the case and when it is obvious from the context that this is not the case. For example, regarding a component, it means "X including A as a main component" or the like. For example, regarding a "silicon member" or the like, it is needless to say that the present invention is not limited to pure silicon, but includes a SiGe (Silicon Germanium) alloy, a multicomponent alloy containing silicon as a main component, and a member including other additives. Also, unless otherwise specified, gold plating, Cu layer, nickel plating and the like it shall not only be pure, but also include components containing gold, Cu, nickel and the like as a main component, respectively.

In addition, reference to a specific numerical value or quantity may be greater than or less than that specific numerical value, unless expressly stated otherwise, theoretically limited to that number, and obviously not so from the context.

In the drawings of the embodiments, the same or similar parts are denoted by the same or similar symbols or reference numerals, and the description will not be repeated in principle.

In addition, in the attached drawings, hatching and the like may be omitted even in a cross-section when it becomes complicated or when it is clearly distinguished from a gap. In this connection, even if the hole is closed in plan, the outline of the background may be omitted when it is obvious from the description or the like. In addition, hatching or dot patterns may be added to indicate that the region is not a void even if it is not a cross-section or to indicate the boundary of the area.

The technique described in the following embodiments can be widely applied to a semiconductor device in which a semiconductor chip mounted on a chip mounting portion is sealed with a sealing body. In the present embodiment, an embodiment applied to a semiconductor device of QFP (Quad Flat Package) type that a lead protrudes from each of four sides of the sealing body having a quadrangular shape in plan view will be described as an example.

Semiconductor Device

Figure 2:
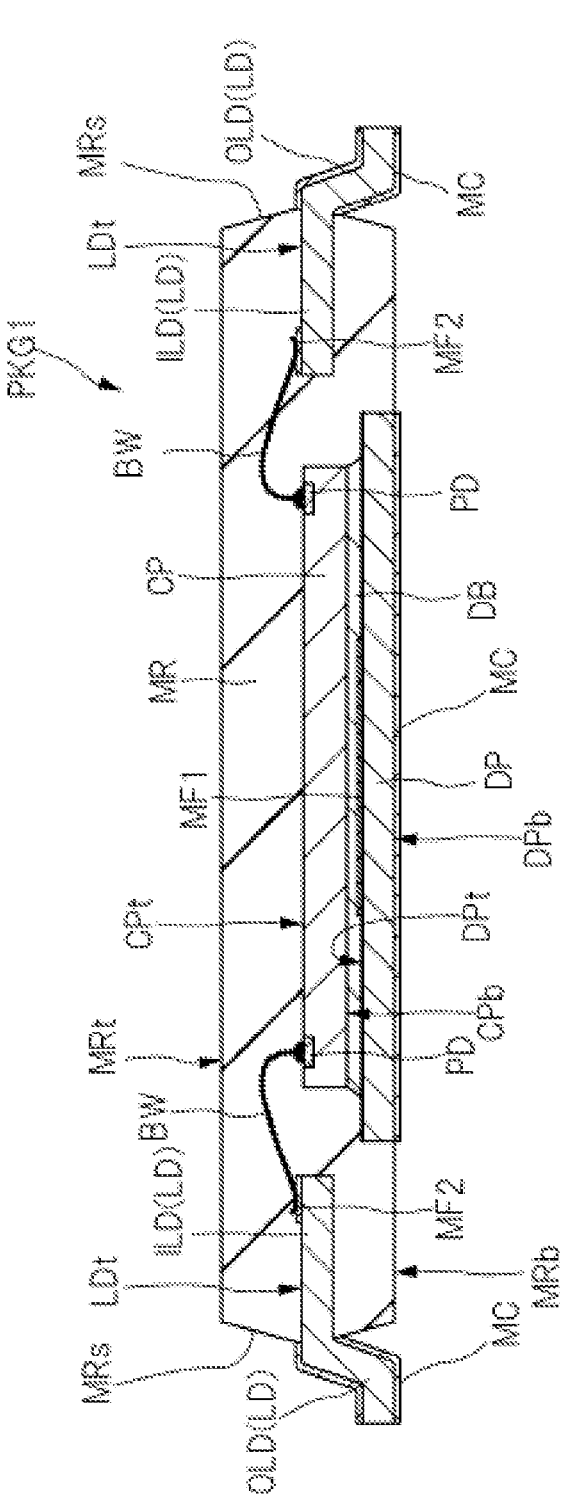
FIG. 2 is a cross-sectional view taken along line A-A of FIG. 1.
Figure 3:
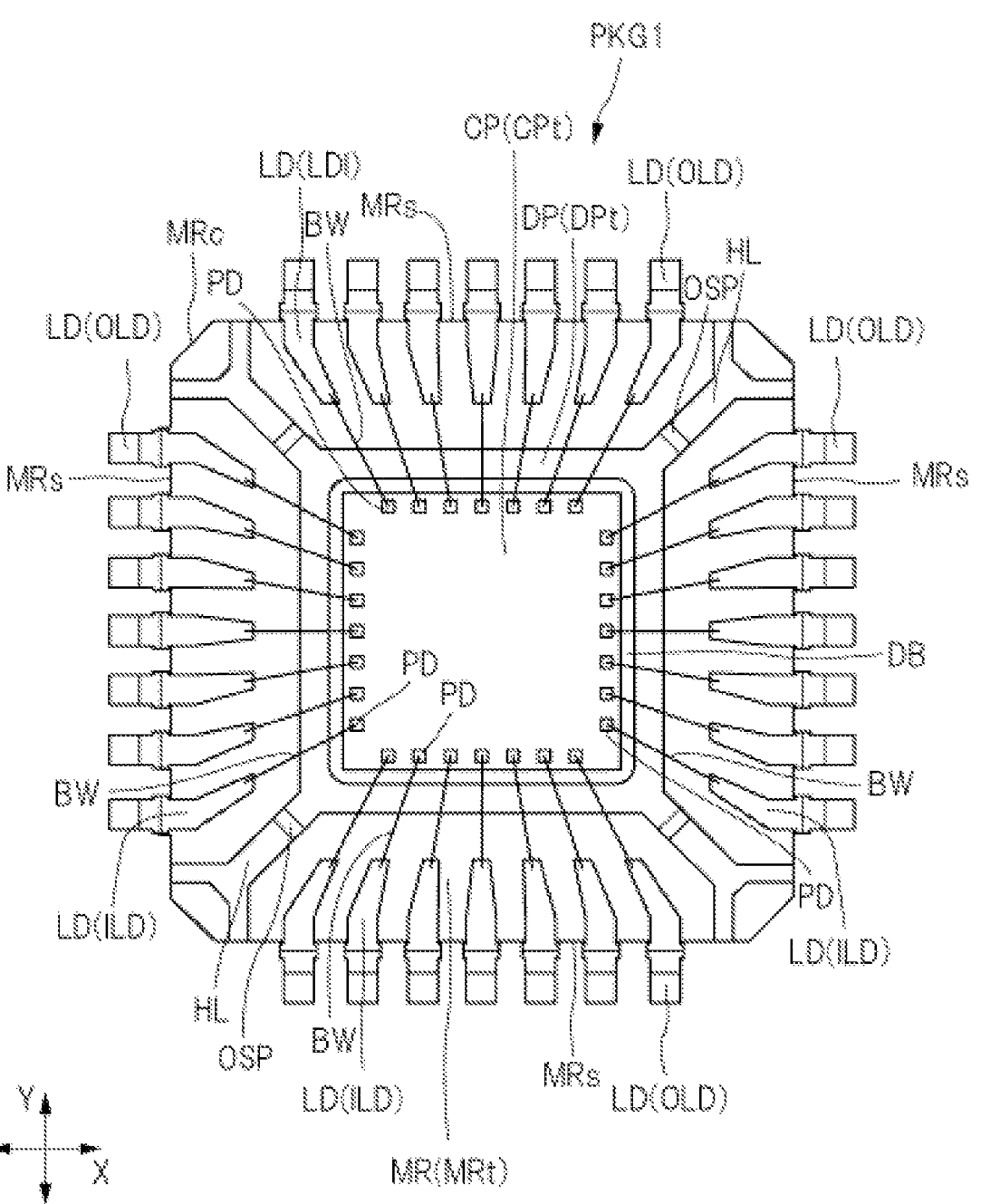
FIG. 3 is a perspective plan view showing an interior of the semiconductor device by seeing through a sealing body shown in FIG. 1.
Figure 4:
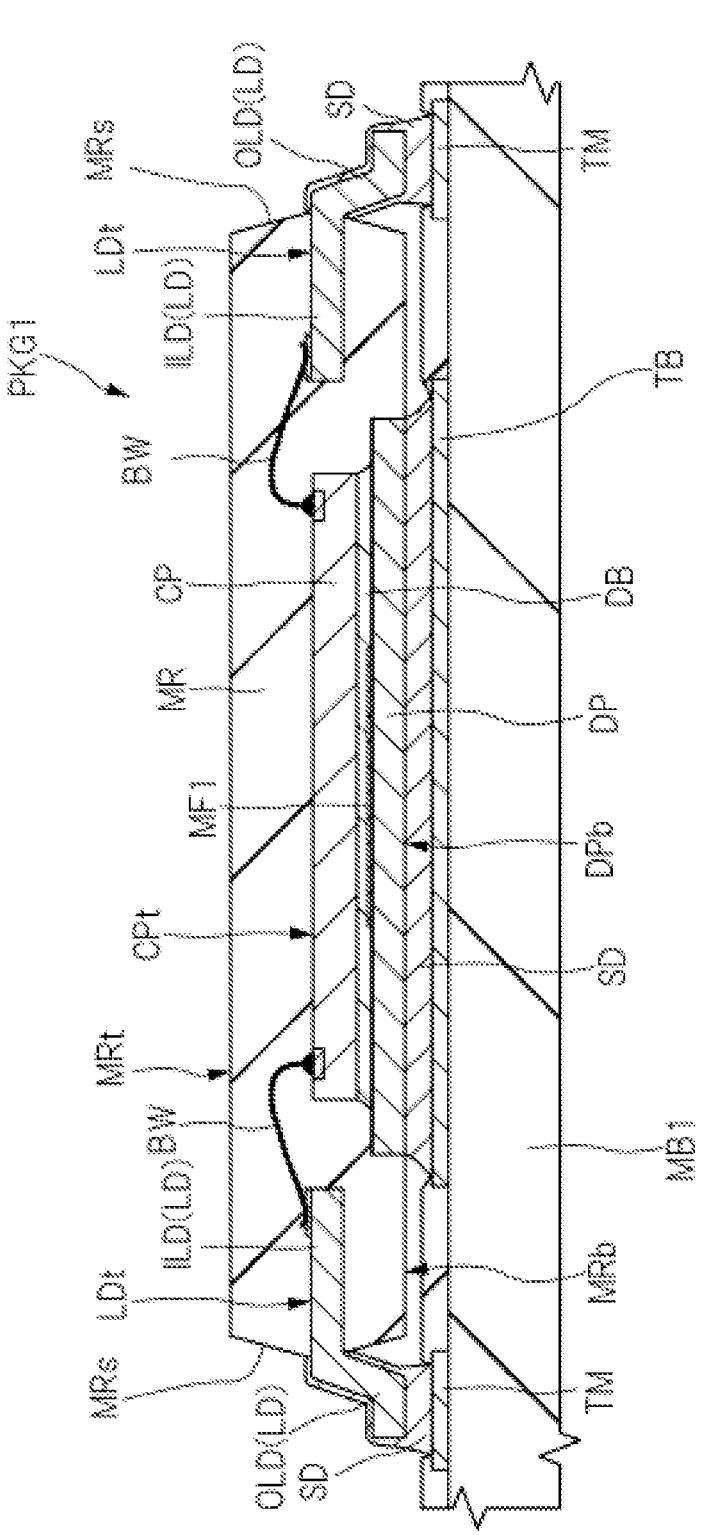
FIG. 4 is an enlarged cross-sectional view showing a state that the semiconductor device shown in FIG. 2 is mounted on a mounting substrate.

First, an abstract of the configuration of a semiconductor device PKG1 of the present embodiment will be described with reference to from FIG. 1 to FIG. 4. FIG. 1 is an upper surface view of the semiconductor device of the present embodiment. FIG. 2 is a cross-sectional view taken along line A-A of FIG. 1. FIG. 3 is a perspective plan view showing an interior of the semiconductor device by seeing through a sealing body shown in FIG. 1. FIG. 4 is an enlarged cross-sectional view showing a state that the semiconductor device shown in FIG. 2 is mounted on a mounting substrate.

As shown in from FIG. 1 to FIG. 3, the semiconductor device PKG1 includes a semiconductor chip CP (see FIG. 2 and FIG. 3) and a die pad (chip mounting portion) DP (see FIG. 2 and FIG. 3) on which the semiconductor chip CP is mounted. The die pad DP has an upper surface (chip mounting surface) DPt (see FIG. 2) and a lower surface (back surface) DPb opposite the upper surface DPt. Also, the semiconductor chip CP includes a plurality of leads LD spaced apart from the die pad DP, a plurality of wires BW (see FIG. 2 and FIG. 3) electrically connecting the semiconductor chip CP and the plurality of leads LD, and a sealing body (resin body) MR (see FIG. 1 and FIG. 2) sealing the plurality of wires BW and the semiconductor chip CP.

The sealing body MR is a resin body containing a resin material as a main component, and contains, for example, filler particles such as silica and a black pigment. As shown in FIG. 1, the sealing body MR of the semiconductor device PKG1 in plan view has a quadrangular shape. The sealing body MR has an upper surface MRt, a lower surface (back surface, mounted surface) MRb (see FIG. 2) opposite the upper surface MRt, and a plurality of (four) side surfaces MRs located between the upper surface MRt and the lower surface MRb. Further, in the embodiment shown in FIG. 1, a corner portion where the respective side surfaces MRs of the sealing body MR intersecting with each other is chamfered.

The semiconductor chip CP shown in FIG. 2 and FIG. 3 has a quadrangular shape in plan view, and a plurality of pads (bonding pads) PD is provided on the front surface CPt along each of four sides composing the outer edge of the front surface CPt. Further, the semiconductor chip CP (specifically, semiconductor substrate) is made of, for example, silicon (Si). Although not shown, the main surface of the semiconductor chip CP (in particular, the semiconductor element forming region provided on the upper surface of semiconductor substrate of the semiconductor chip CP), a plurality of semiconductor elements (circuit elements) is formed. Then, a plurality of pads PD, the interior of the semiconductor chip CP (specifically, between the front surface CPt and the semiconductor element forming region (not shown)) through the wiring formed in the wiring layer to be disposed (not shown), the semiconductor element and electrically connected. That is, a plurality of pads PD is electrically connected to a circuit formed in the semiconductor chip CP.

Further, an insulating film covering a substrate and a wiring of the semiconductor chip CP is formed on the front surface CPt of the semiconductor chip CP, and the surface of each of the plurality of pads PD is exposed from the insulating film in the opening formed in the insulating film. In addition, the pad PD is made of a metal. In the present embodiment, for example, it is made of aluminum (Al).

The semiconductor chip CP is mounted on the die pad DP that is a chip mounting portion. In the embodiment shown in FIG. 3, the upper surface (chip mounting surface) DPt of the die pad DP is formed of a quadrangular having an area larger than the area of the front surface CPt of the semiconductor chip CP. The die pad DP is a support member that supports the semiconductor chip CP, and various modified example can be applied to the shapes and sizes in addition to those shown in FIG. 3.

As shown in FIG. 3, a plurality of suspension leads HL is disposed around the die pad DP. Each suspension lead HL is a member for supporting the die pad PD to a support portion (frame portion) of a lead frame in a manufacturing process of the semiconductor device PKG1, and in the embodiment shown in FIG. 3, four suspension leads HL are arranged so as to extend from the corner of the die pad DP toward the respective corner of the sealing body MR. For detail, one end portion of each of the plurality of suspension leads HL is connected to a corner portion (corner) of the die pad DP. The other end portion of each of the plurality of suspension leads HL extends toward the corner portion of the sealing body MR, is divided into two parts at the vicinity of the corner portion, and is exposed from the sealing body MR at the side surfaces MRs of the sealing body MR.

In addition, in the present embodiment, the upper surface DPt of the die pad DP and the upper surface of the inner lead portion ILD of the lead LD are disposed at different heights with each other. In the embodiment shown in FIG. 2, the upper surface DPt of the die pad DP is disposed at a lower position than the position of the upper surface LDt of the inner lead portion ILD. For this reason, each of the plurality of suspension leads HL shown in FIG. 3 is provided with an offset portion OSP that is bent so that the height of the upper surface DPt of the die pad DP is located at a height that differs from the upper surface LDt (see FIG. 2) of the inner lead portion ILD of the lead LD.

Figure 6:
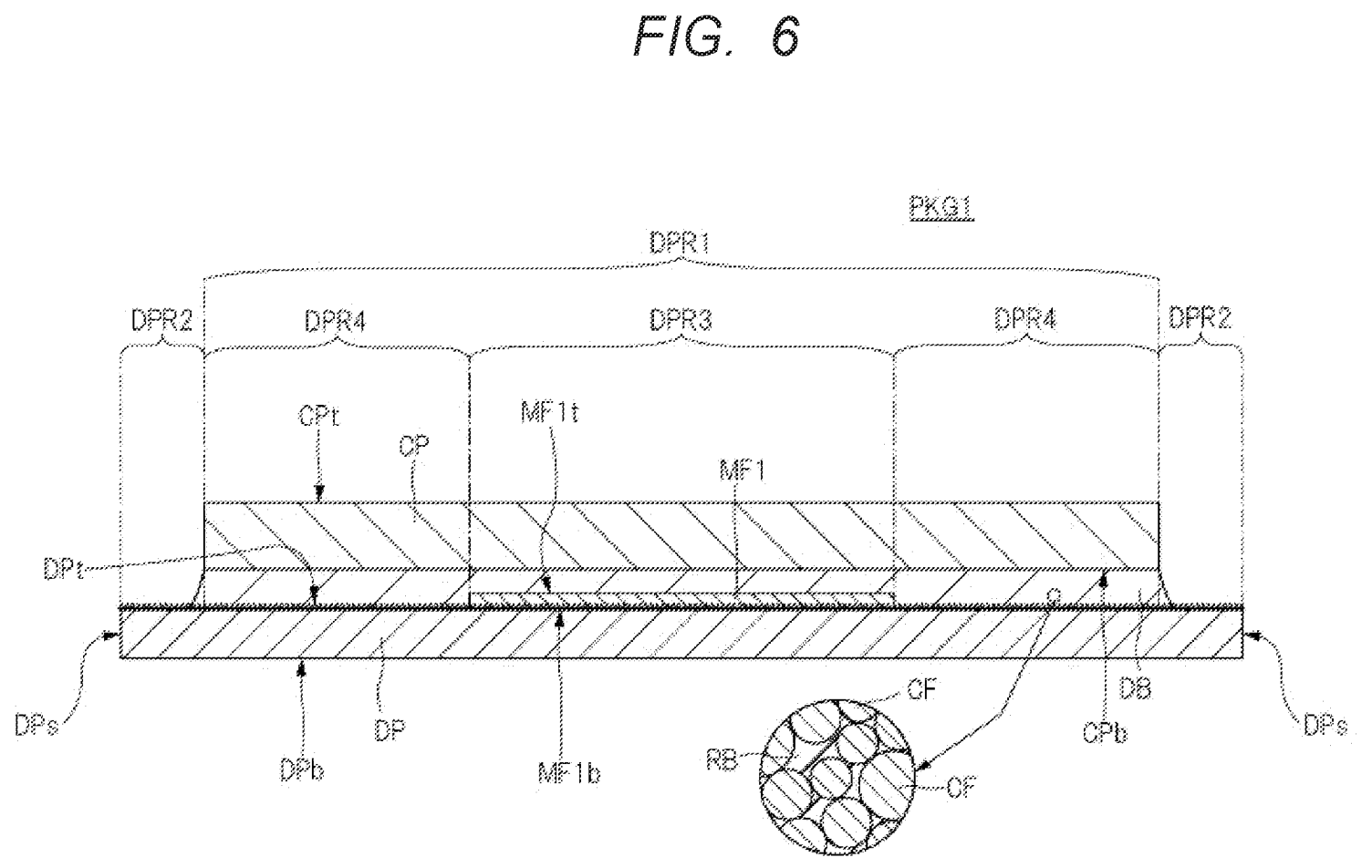

The semiconductor chip CP is mounted on the die pad DP at the center of the die pad DP. As shown in FIG. 2, the semiconductor chip CP is mounted on the die pad DP via a bonding material (die bonding material) DB such that the back surface CPb faces the upper surface DPt of the die pad DP. As shown in FIG. 6, which will be described later, a bonding material DB is made of a conductive resin including a resin body RB and a plurality of metal particles CF included in the resin body RB. Examples of the conductive resin include an adhesive material called a so-called silver paste in which a metal particle CF made of silver or the like is contained in an epoxy based thermosetting resin (resin body RB). The bonding material DB is disposed so as to cover a metal film MF1 formed on a part of the upper surface DPt of the die pad DP. A detailed configuration of a portion where the semiconductor chip CP and the die pad DP are bonded to each other will be described later.

For example, a plurality of leads LD is arranged around the semiconductor chip CP (in other words, around die pad DP). Each of the plurality of leads LD is an external terminal having a function of electrically connecting the semiconductor device PKG1 to an external device (not shown). In the semiconductor device PKG 1, a plurality of leads LD is arranged along each side (each main side) of the sealing body MR having a quadrangular shape in plan view. The inner lead portion ILD (see FIG. 2 and FIG. 3) of each of the plurality of leads LD is sealed with the sealing body MR, and the outer lead portion OLD of each of the plurality of leads LD is exposed from the sealing body MR. The outer lead portions OLD of each of the plurality of leads LD protrudes toward the outer side of the sealing body MR at the side surface MR of the sealing body MR. The plurality of pads (bonding pads) PD exposed at the front surface CPt of the semiconductor chip CP is electrically connected with the inner lead portions ILD of the plurality of leads LD located inside the sealing body MR via the plurality of wires (conductive members) BW, respectively.

The die pad DP and the plurality of leads LD are made of the same metal material with each other. The metal material of each of the die pad DP and the plurality of leads LD is, for example, copper, an alloy containing copper, or an alloy containing iron (42 alloy).

Each of the plurality of wires BW is a thin metal wire electrically connecting a plurality of pads (bonding pads) PD (see FIGS. 2 and 3) and a plurality of leads provided on the front surface CPt (see FIG. 2) of the semiconductor chip CP. One end of the wire BW is bonded to the pad PD, and the other end is bonded to a metal film MF2 (see FIG. 2) formed on the upper surface LDt (see FIG. 2) of the lead LD. Specifically, the metal film MF2 is formed on the inner lead portion ILD (see FIG. 2) sealed on the sealing body MR of the lead LD. Each of the plurality of wires BW is sealed by a sealing body MR. Thus, deformation or the like of the wire BW can be prevented.

The wire BW is made of, for example, gold (Au) or copper (Cu). A part (e.g., one end) of the wire BW is bonded to the pad PD, and the other part (e.g., the other end) is bonded to the end portion of the inner lead portion ILD. A metal film (plating film, plating metal film) MF2 (see FIG. 2) is formed on a surface of the end portion of the inner lead portion ILD. The metal film MF2 is made of, for example, silver (Ag) or gold (Au). By forming the metal film MF2 made of silver or gold as a main component on a surface of the bonding portion WBR of the inner lead portion ILD, the bonding strength with the wire BW can be improved.

As shown in FIG. 2, a metal film (exterior plating film) MC is formed on the exposed surface of the outer lead portion OLD of each of the plurality of leads LD (for example, on the surface of the base material). The metal film (exterior plating film) MC is formed on the exposed surface of the die pad DP, which is exposed from the sealing body MR, namely the lower surface DPb. By exposing the lower surface DPb of the die pad DP from the sealing body MR, heat dissipation from the die pad DP to the outside of the semiconductor device PKG1 can be improved.

The metal film MC is, for example, a metal film made of a metal material having better wettability to solder than copper as a base material, such as solder, and covering the surface of the copper member as a base material. By forming a metal film MC made of solder or the like on each of the outer lead portions OLD of the plurality of leads LD that are external terminals of the semiconductor device PKG1, the wettability of the solder material SD that is a conductive connecting material can be improved when the semiconductor device PKG1 is mounted on the mounting substrate MB1 as shown in FIG. 4. As a result, the bonding strength between the plurality of leads LD and the terminal TM of the mounting substrate MB1 can be improved, as the bonding area between the plurality of leads LD and the solder material SD is increased.

Further, as shown in FIG. 4, when the die pad DP and the heat sink TB of the mounting substrate MB1 are thermally connected via the solder material SD, the heat dissipation efficiency can be further improved. When connecting the die pad DP and the solder material SD, from the viewpoint of improving the wettability of the solder material SD on the lower surface DPb of the die pad DP, the lower surface DPb of the die pad DP exposed from the sealing body MR, it is preferable to form a metal film MC made of solder or the like (see FIG.2).

<Detailed Structure of Chip Mounting Portion>

Figure 5:
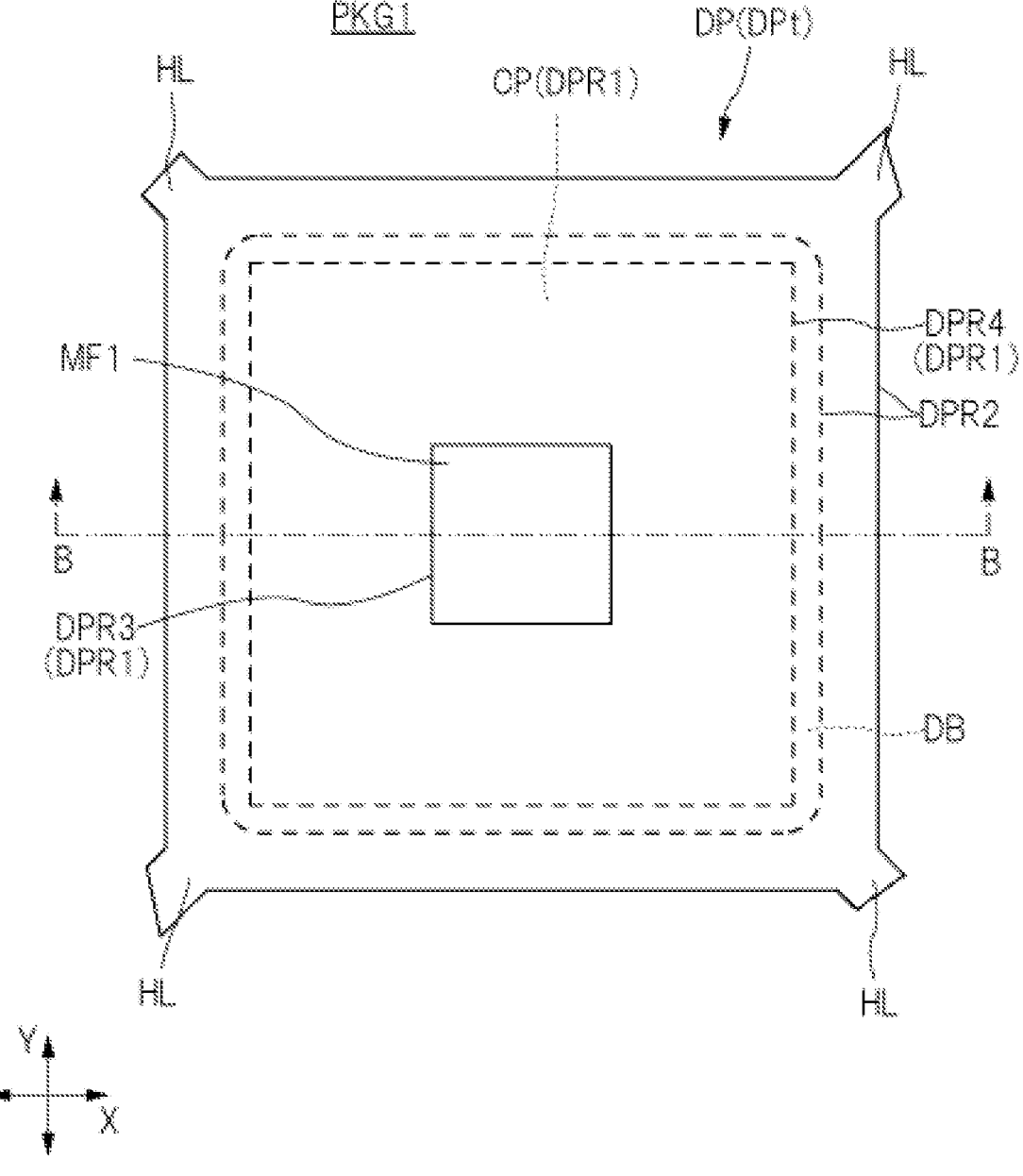
FIG. 5 is an enlarged plan view of a die pad without showing a plurality of wires shown in FIG. 3, and showing an outline of each of a semiconductor chip shown in FIG. 3 and a bonding material shown in FIG. 3 by a dotted line.

Next, a detailed configuration on the die pad DP structure in FIG. 3 will be described. FIG. 5 is an enlarged plan view of a die pad without showing a plurality of wires shown in FIG. 3, and showing an outline of each of a semiconductor chip shown in FIG. 3 and a bonding material shown in FIG. 3 by a dotted line. FIG. 6 is an enlarged cross-sectional view taken along line B-B of FIG. 5. In FIG. 6, the bonding material DB and a semiconductor chip CP which are not illustrated in FIG. 5 are illustrated.

As shown in FIG. 5, the semiconductor device PKG1 includes a metal film MF1 formed on the upper surface DPt of the die pad DP and the bonding material DB. As illustrated in FIG. 6, the bonding material DB includes a resin body RB and a plurality of metal particles CF included in the resin body RB. Each of the metal film MF1 and the bonding material DB is located between the semiconductor chip CP and the die pad DP.

As shown in FIGS. 5 and 6, the upper surface DPt of the die pad DP includes a region DPR1 overlapping the semiconductor chip CP, a region DPR2 adjacent to the region DPR1 so as to surround the region DPR1 and not overlapping the semiconductor chip CP, a region DPR3 included in the region DPR1 and covered with the metal film MF1, and a region DPR4 included in the region DPR1 and adjacent to the region DPR3 and also not covered with the metal film MF1. As shown in FIG. 5, the metal film MF1 (that is, the region DPR3 where the metal film MF1 is formed on the upper surface thereof) is formed at the center of the upper surface DPt of the die pad DP. As shown in FIGS. 5 and 6, the semiconductor chip CP is mounted on the die pad DP such that the center of the semiconductor chip CP overlaps with the region DPR3.

The metal film MF1 is comprised of a metal material which is less likely to be oxidized than a metal material of the die pad DP. The "difficulty of oxidation" of a metal material can be defined by comparison of the ionization tendency f the metal. When the metal material composing the die pad is copper or iron (specifically, 42 alloy which is an alloy containing iron), the metal film MF1 is made of copper (which may be a copper alloy) and a metal material having a smaller ionization tendency than iron. For example, silver (Ag), gold (Au) or the like can be exemplified as a metal material having a smaller ionization tendency than copper and iron.

Further, as shown in FIG. 6, the roughness (surface roughness) of the upper surface DPt in the region DPR4 is rougher than the roughness (surface roughness) of the surface (contacting surface), to which the bonding material DB is to be contacted, of the metal film MF1. In the present embodiment, after roughening treatment is performed on the entire upper surface DPt of the die pad DP, a metal film MF1 is formed on the region DPR3 of the upper surface DPt of the die pad DP by a plating method. In this case, of the metal film MF1 shown in FIG. 6, the surface roughness of the lower surface MF1*b* facing the die pad DP is rougher than the surface roughness of the upper surface MFlt not facing the die pad DP. The surface roughness of the metal film MF1 at the interface between the metal film MF1 and the bonding material DB means the surface roughness of the upper surface MFlt shown in FIG. 6.

Figure 7:
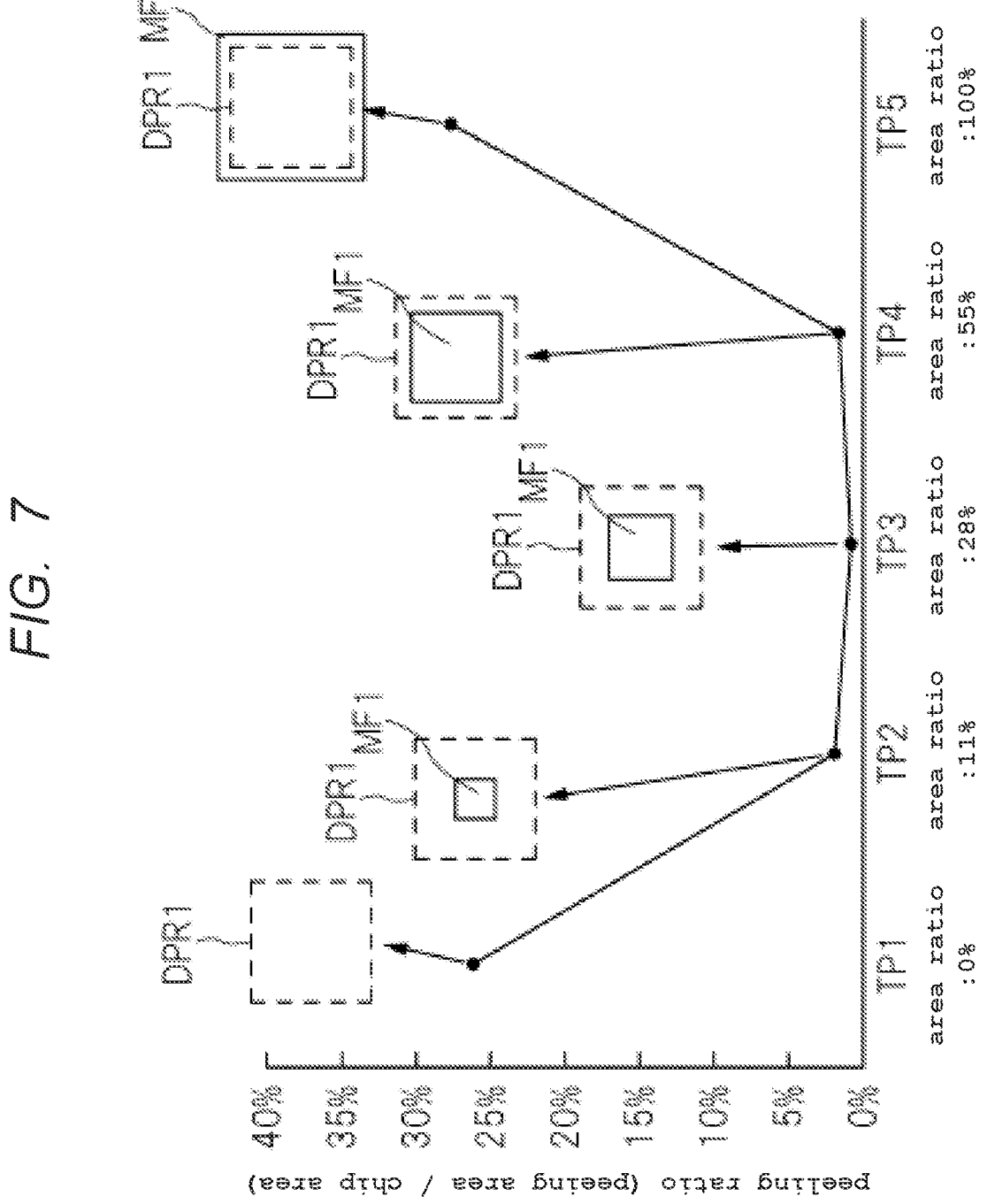
FIG. 7 is an explanatory view showing a relationship between an area ratio of a region on which a metal film shown in FIG. 5 is formed and a peeling ratio of the bonding material.

Here, the area of the region DPR3 is preferably greater than or equal to 11% of the area of the region DPR1, and less than or equal to 55% of the area of the region DPR1. In the embodiment shown in FIG. 5, the area is 11% of the area of the region DPR1. The reason for this will be described below. FIG. 7 is an explanatory view showing a relationship between an area ratio of a region on which a metal film shown in FIG. 5 is formed and a peeling ratio of the bonding material. In FIG. 7, the horizontal axis represents the area ratio of the region DPR3 with respect to the region DPR1 shown in FIG. 5. The first test section TP1 on the left most side of the drawing shows an assessment of the article that does not form a metal film MF1. The fifth test section TP5 on the rightmost side with respect to the drawing shows an assessment of the article in which the metal film MF1 is formed so as to cover the entire region DPR1 shown in FIG. 5. Each of the second test section TP2, the third test section TP3 and the fourth test section TP4 between the first test section TP1 and the fifth test section TP5 indicates an assessment for a product in which the area of the region DPR3 covered with the metal film MF1 is different. Further, in FIG. 7, the vertical axis, in each test section, the bonding material DB shown in FIG. 6, the value of the area of the part where peeling occurred at the interface between the die pad DP (or the metal film MF1) is shown as a peeling ratio divided by the area of the region DPR1 shown in FIG. 5. From the viewpoint of improving the heat dissipation efficiency of semiconductor device, it is preferable that the bonding material DB shown in FIG. 6 and the die pad DP and the metal film MF1 are not peeled off from each other. Therefore, it can be said that a lower peeling ratio is preferable.

In case that a semiconductor chip is mounted by directly contacting a resin adhesive material containing a metal particle on a chip mounting portion made of a metal material which is easily oxidized, such as copper (Cu) or iron (Fe), the upper surface of the chip mounting portion is easily oxidized prior to the die bonding step in which the semiconductor chip is mounted. When the die bonding process is performed while the upper surface is oxidized, peeling is likely to occur between the oxidized upper surface and the resin adhesive. Therefore, as shown in FIG.6, between the die pad DP and the bonding material DB, by interposing a metal film MF1 made of a metal material hardly oxidized than the metal material of the die pad DP, it was examined whether it is possible to suppress the peeling. First, as shown as a fifth test section TP5 in FIG. 7, a metal film MF1 was formed on the entire die pad DP (see FIG. 6).

As shown in FIG. 7, it was confirmed that the peeling ratio was more than 25% in the product of the fifth test section TP5. This is considered that the stress applied to the peripheral portion of the semiconductor chip CP due to the heating process in the manufacturing process of the product or the heat applied in the heating process at the time of mounting the product exceeded the bonding strength between the bonding material DB (see FIG. 6) and the metal film MF1. The linear expansion coefficient of silicon (Si) used in the semiconductor substrate of the semiconductor chip CP is greatly different from the linear expansion coefficient of the metal material composing the die pad DP which is a plate shaped metal member. Therefore, when the planar size of the semiconductor chip CP is increased, the stress applied to the vicinity of the peripheral portion of the semiconductor chip CP is increased. In the present embodiment, the bonding strength between the bonding material DB and the metal film MF1 is lower than the bonding strength between the bonding material DB and the die pad DP. Thus, if the stress applied to the vicinity of the peripheral portion of the semiconductor chip CP enlarges, the peeling will occur at the interface of the bonding material DB and the metal film MF1 in the peripheral portion of the semiconductor chip (see FIG. 6), and the peeling will progress toward the center.

In addition, it was confirmed that the peeling ratio was more than 25% in the product of the first test section TP1 shown in FIG. 7. The roughening treatment on the adhesive surface is performed for the purpose of increasing the contact area between the bonding material and the die pad as an object to be bonded, or for the purpose of obtaining an anchoring effect by the roughened surface. Therefore, it was considered that the product of the first test section TP1 including the die pad DP (see FIG. 6) having the upper surface DPt (see FIG. 6) on which the metal film MF1 is not formed and roughened can suppress the peeling ratio. However, as shown in the evaluation result in FIG. 7, it was found that peeling occurred over a wide range. It is believed that the gas trapped between the upper surface DPt of the roughened die pad DP and the bonding material DB (see FIG. 6) thermally expanded to cause delamination. In this mode, peeling is observed at the center of the die pad DP and is progressing toward the peripheral region. Therefore, in the peripheral region of the die pad DP, even if a gas is contained between the upper surface DPt of the die pad DP and the bonding material DB, this gas is likely to escape to the periphery of the bonding material DB in the process of mounting the semiconductor chip CP (see FIG. 6) on the die pad DP. On the other hand, in the center portion of the die pad DP, it is considered that the gas is easily confined due to a long path for leaking the gas.

Here, the peeling ratio of each of the second test section TP2 (area ratio is 11%), the third test section TP3 (area ratio is 28%) and the fourth test section TP4 (area ratio is 55%) shown in FIG. 7 is less than 5% (about from 0.5% to 2.5%). In other words, in case of each of the second test section TP2, the third test section TP3 and the fourth test section TP4, the peeling ratio can be reduced by 90% or more with respect to the peeling ratio of each of the first test section TP1 and the fifth test section TP5.

In case of each of the second test section TP2, the third test section TP3 and the fourth test section TP4, a metal film MF1 made of a metal material which is less likely to be oxidized than the metal of the die pad DP (see FIG. 6) is formed in the central portion where the gas is likely to be confined. Thus, generating of the peeling by an oxide film can be inhibited in the region DPR3 (see FIG. 5) located in the central portion of region DPR1. Also, the surface roughness of the metal film MF1 is smoother than the surface roughness of the upper surface DPt (see FIG. 6) of the die pad DP. Thereby, in the region DPR3 (see FIG. 5) located in the central portion of the region DPR1, it is possible to suppress the occurrence of the peeling caused by the confinement of the gas.

Further, in each of the second test section TP2, the third test section TP3 and the fourth test section TP3, in the peripheral portion (region DPR4 shown in FIG. 5) to which the stresses from the semiconductor chip CP (see FIG. 6) are likely to be applied, the upper surface DPt (see FIG. 6) and the bonding material DB (see FIG. 6) of the roughened die pad DP (see FIG. 6) are in close contact. In the peripheral portion, when the upper surface DPt of the die pad DP is roughened, interface peeling with the bonding material DB can be suppressed even when an oxide film is formed on the upper surface DPt. In the peripheral portion, the gas between the bonding material DB and the die pad DP is easily discharged to the periphery of the bonding material DB. Therefore, the occurrence of peeling at the peripheral portion can be suppressed.

It is considered that, as described above, each of the second test section TP2, the third test section TP3, and the third test section TP3 was able to reduce the peeling ratio by taking separate peeling countermeasures in each of the region DPR3 and the region DPR4.

From the results shown in FIG. 7 and the above discussion, it was found that when the area of the region DPR3 shown in FIG. 5 is 11% or more with respect to the area of the region DPR1 and 55% or less with respect to the area of the region DPR1, the peeling of the bonding material DB shown in FIG. 6 can be suppressed. In other words, in case that the region of the semiconductor chip CP (that is, the area of the region DPR1) is greater than or equal to 25 mm², even in a configuration that the upper surface DPt of the die pad DP, which is roughened at the peripheral portion where the stress is to be applied from the semiconductor chip CP, and the bonding material DB come into contact with each other, the peeling of the bonding material DB may occur when the area ratio of the region DPR3 is less than 11% or 56% or more, peeling of the bonding material DB may occur. In addition, it has been found that the heat dissipation property of the heat dissipation path from the semiconductor chip CP to the die pad DP can be improved by suppressing the peeling of the bonding material DB.

Incidentally, in the metal film MF1 shown in FIG. 6, it is sufficient to prevent an oxide film from being formed at the adhesion interface with the bonding material DB until the die bonding step is performed. Therefore, as the metal material constituting the metal film MF1, various materials can be used as long as the metal material is less likely to be oxidized (in other words, less prone to ionization) than the metal material constituting the die pad DP. However, from the viewpoint of improving the heat dissipation characteristics, it is preferable that the thermal conductivity characteristics of the metal film MF1 itself be higher. From this point of view, it is particularly preferable that the metal film MF1 is made of silver or gold, such as the present embodiment.

It has been found that the peeling phenomena in the fifth test section TP5 shown in FIG. 7 becomes particularly remarkable, when the area of the semiconductor chip CP (see FIG. 6), in other words, the area of the region DPR1 is greater than or equal to or larger than 25 mm². Further, it has been found that the peeling ratio shown in FIG. 7 can be greatly reduced by taking the above-described measures within the area of the semiconductor chip CP, in other words, the area of the region DPR1 is equal to or larger than 25 mm² and 100 mm² or less. In FIG. 7, the area of the region DPR1 is 54.76 mm² (a square having a 7.4 mm length on one side) and semiconductor device is evaluated.

Further, as shown in FIG. 2, the upper surface DPt of the die pad DP and the sealing body MR are in contact with each other at around the bonding material DB. In other words, the region DPR2 of the upper surface DPt of the die pad DP shown in FIG. 5 is in contact with the sealing body MR shown in FIG. 2. If a gas remains between the bonding material DB and the die pad DP, the peeling of the sealing body MR and the die pad DP occurs. In the present embodiment, the gas arisen between the bonding material DB and the die pad DP is discharged into the atmosphere in the die bonding process. Therefore, it is possible to prevent the occurrence of peeling caused by the gas.

Further, as shown in FIG. 2, a metal film MF2 is formed at a portion of each of the plurality of leads LD (a distal end portion of upper surface LDt of the inner lead portion IL D). Each of the plurality of wires BW is bonded to the metal film MF2. The metal film MF2 is a plated film formed in order to improve the reliability of electrically connecting the wire BW and the lead LD. The metal film MF1 and the metal film MF2 are formed of the same metal material (for example, silver or gold). As described above, in the manufacturing process, the metal film MF1 and the metal film MF2 can be collectively formed in the same process when the metal film MF1 and the metal film MF2 are formed of the same metal material.

Further, as shown in FIG. 2, the lower surface DPb of the die pad DP is exposed from the sealing body MR. In view of the heat dissipation from the die pad DP, it is particularly preferable that the lower surface DPb of the die pad DP is exposed from the sealing body MR. However, although not shown, as a modified example, the lower surface DPb of the die pad DP may not be exposed from the sealing body MR and may be sealed to the sealing body MR.

Modified Example

Figure 8:
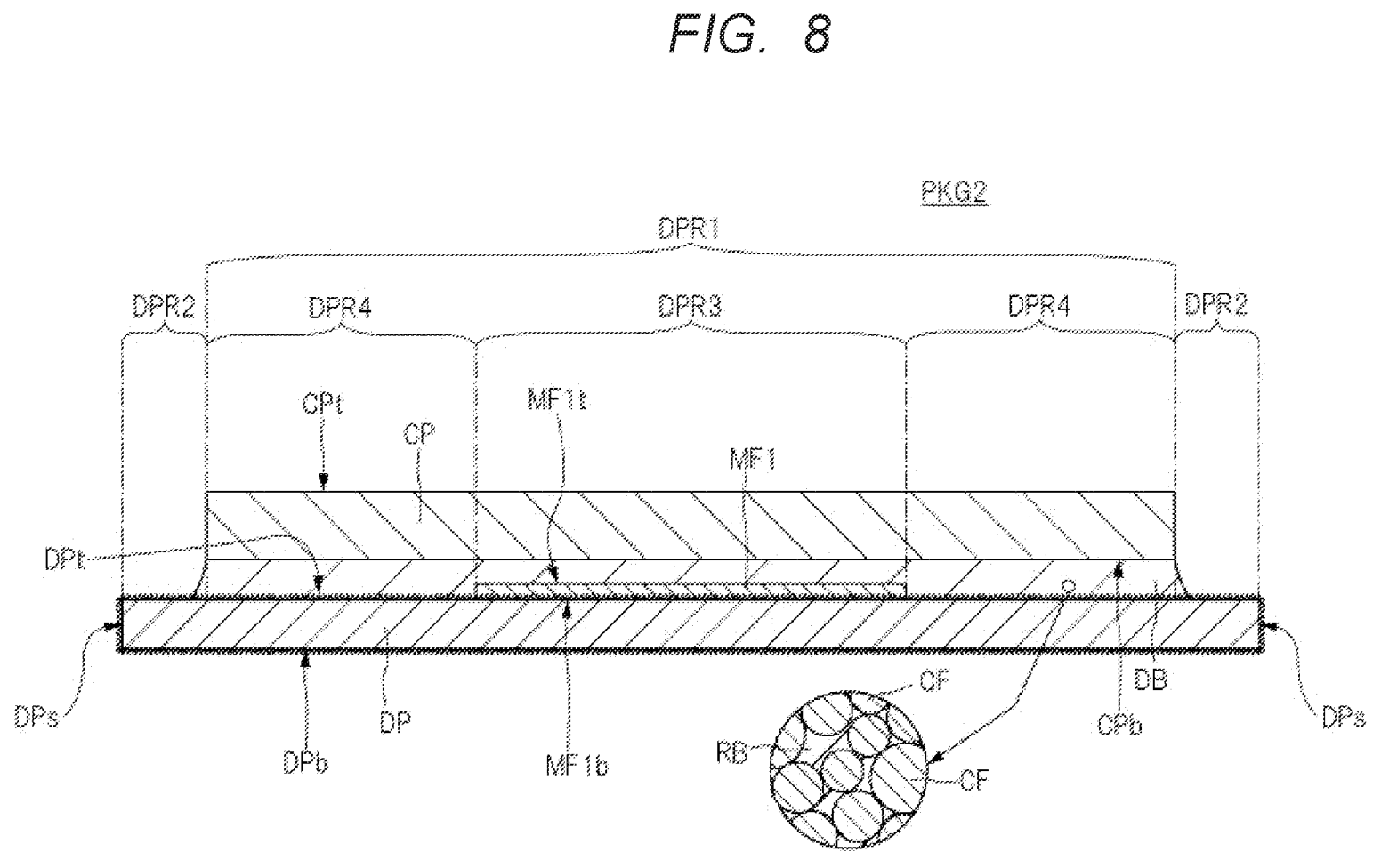

Next, some modified examples will be described. FIG. 8 is an enlarged cross-sectional view showing a modified example with respect to FIG. 6. In the semiconductor device PKG1 shown in FIG. 6, only the upper surface DPt of the die pad DP is roughened, and the side surface DPs and the lower surface DPb are not roughened. The side surface DPs is a surface intersecting upper surface D Pt and the lower surface DPb. From the viewpoint of the above-described peeling countermeasure, it is sufficient that at least the upper surface DPt of the die pad DP is roughened.

However, when only the upper surface DPt is selectively roughened as shown in FIG. 6, the roughening treatment needs to be performed while the lower surface DPb and the side surface DPs are masked. In a semiconductor device PKG2 shown in FIG. 8, each of the side surface DPs and the lower surface DPb is roughened in the same manner as the upper surface DPt. The surface roughness of each of the upper surface DPt, the lower surface DPb, and the side surface DPs of the die pad DP is rougher than the surface roughness of the metal film MF1 at the interface (upper surface MF1*t*) between the metal film MF1 and the bonding material DB.

In the semiconductor device PKG2, since the lower surface DPb and the side surface DPs do not need to be masked in the roughening treatment, the work efficiency can be improved. In addition, since the side surface DPs is roughened, the adhesion strength between the sealing body MR (see FIG. 2) and the side surface DPs can be improved.

Figure 9:
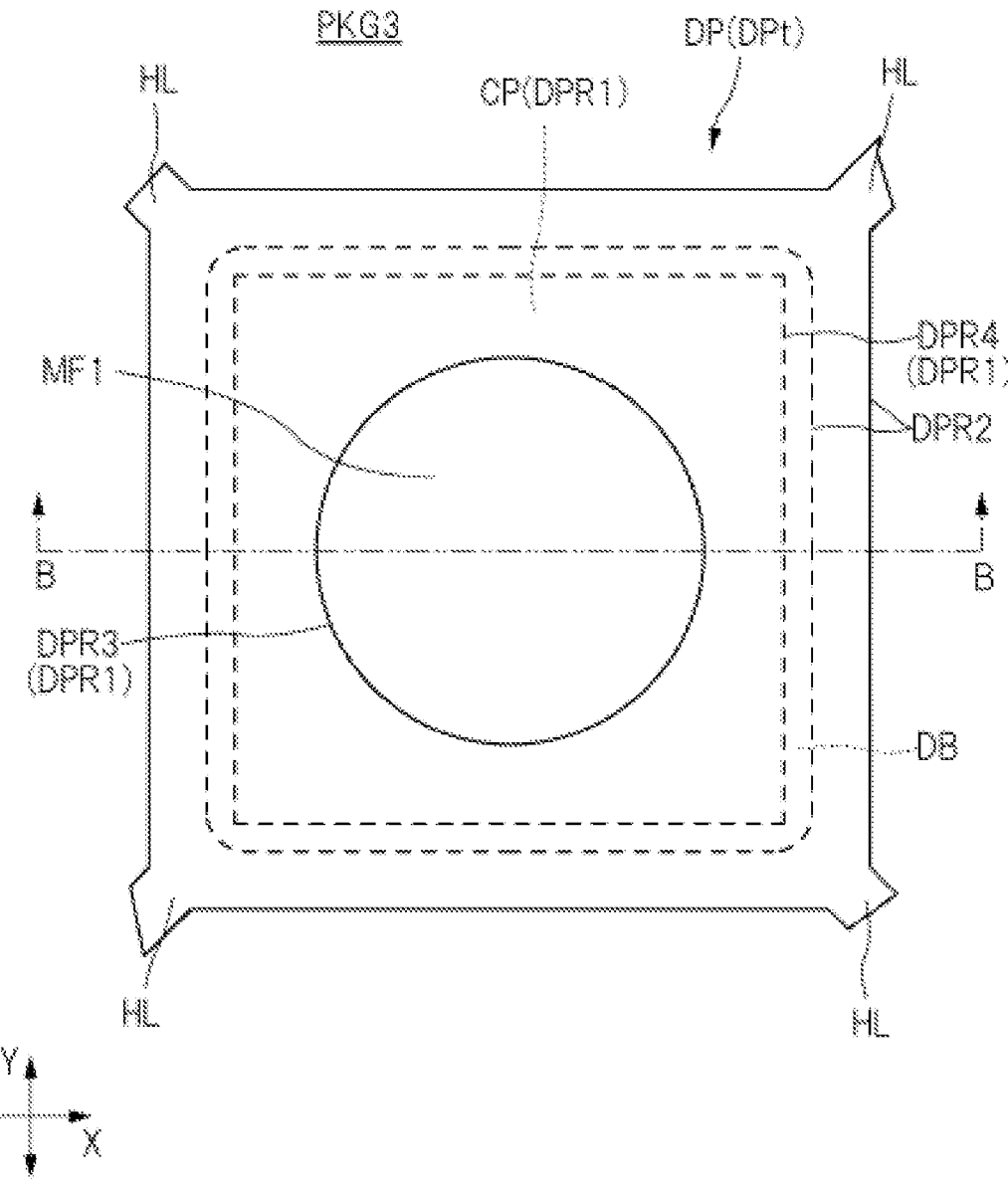
FIG. 9 is an enlarged plan view showing a modified example of a shape of the metal film shown in FIG. 5.

FIG. 9 is an enlarged plan view showing a modified example of a shape of the metal film shown in FIG. 5. A semiconductor device PKG3 differs from the semiconductor device PKG1 shown in FIG. 5 in the form of the metal film MF1. The semiconductor device PKG3 metal film MF1 has a circular planar configuration, for example. A circular metal film MF1 having no corner portion has an advantage that stress concentration is less likely to occur than a rectangular metal film having a corner portion. Therefore, even when the area of the metal film MF1 is large, it is easy to suppress the generation of peeling caused by the stresses. In addition to the circular shape shown in FIG. 9, various modified example such as an elliptical shape and a polygonal shape can be applied to the planar shape of the metal film MF1.

Although the invention made by the present inventor has been specifically described based on the embodiment, the present invention is not limited to the above embodiment, and it is needless to say that various modifications can be made without departing from the gist thereof.

What is claimed is:

1. A semiconductor device comprising:
a semiconductor chip;
a chip mounting portion having: a first surface facing the semiconductor chip, and a second surface opposite the first surface;
a first metal film formed on the first surface of the chip mounting portion; and
a bonding material formed so as to cover the first metal film, the bonding material including: a resin body, and a plurality of metal particles included in the resin body,
wherein the first metal film and the bonding material are located between the semiconductor chip and the chip mounting portion,
wherein the first surface of the chip mounting portion has:
a first region overlapping the semiconductor chip,
a second region adjacent to the first region so as to surround the first region, the second region not overlapping the semiconductor chip,
a third region included in the first region, the third region being covered with the first metal film, and
a fourth region included in the first region, the fourth region being adjacent to the third region, and the fourth region being not covered with the first metal film,
wherein the semiconductor chip is mounted on the chip mounting portion such that a center of the semiconductor chip overlaps the third region,
wherein the first metal film comprises silver or gold, wherein the chip mounting portion comprises copper or iron,
wherein a surface roughness of the first surface in the fourth region is rougher than a surface roughness of a contacting surface of the first metal film, the contacting surface being a surface to which the bonding material is to be contacted, and
wherein an area of the third region is greater than or equal to 11% of an area of the first region, and less than or equal to 55% of the area of the first region.

2. The semiconductor device according to claim 1,
wherein the chip mounting portion further has a third surface crossing to each of the first surface and the second surface, and
wherein the surface roughness of the first surface, a surface roughness of the second surface and a surface roughness of the third surface are rougher than the surface roughness of the contacting surface of the first metal film.

3. The semiconductor device according to claim 1, wherein the first metal film is comprised of one of silver and gold.

4. The semiconductor device according to claim 1, wherein the chip mounting portion is comprised of one of copper, an alloy containing copper, and an alloy containing iron.

5. The semiconductor device according to claim 1, wherein the area of the first region is greater than or equal to 25 mm², and less than or equal to 100 mm².

6. The semiconductor device according to claim 1, further comprising:
a plurality of leads spaced apart from the chip mounting portion;
a plurality of wires electrically connecting the semiconductor chip and the plurality of leads; and
a sealing body sealing the plurality of wires and the semiconductor chip,
wherein the second region of the first surface of the chip mounting portion is in contact with the sealing body.

7. The semiconductor device according to claim 6,
wherein a second metal film is formed on a first portion of each of the plurality of leads,
wherein the plurality of wires is bonded to the plurality of leads, respectively, at the second metal film, and
wherein a metal material of the second metal film is the same as the metal material of the first metal film.

8. The semiconductor device according to claim 6, wherein the second surface of the chip mounting portion is exposed from the sealing body.

9. The semiconductor device according to claim 1, wherein, in plan view, the semiconductor chip is comprised of a quadrangular shape.

* * * * *